United States Patent
Shih et al.

[11] Patent Number: 5,883,002
[45] Date of Patent: Mar. 16, 1999

[54] METHOD OF FORMING CONTACT PROFILE BY IMPROVING TEOS/BPSG SELECTIVITY FOR MANUFACTURING A SEMICONDUCTOR DEVICE

[75] Inventors: Hsueh-Hao Shih; Jing-Hua Chiang, both of Hsinchu, Taiwan

[73] Assignee: Winbond Electronics Corp., Taipei, Taiwan

[21] Appl. No.: 697,769

[22] Filed: Aug. 29, 1996

[51] Int. Cl.[6] .................................................. H01L 21/469
[52] U.S. Cl. .......................... 438/640; 438/673; 438/701; 438/978
[58] Field of Search .................................. 438/640, 673, 438/701, 745, 978, 756, 723; 252/79.3, 79.4

[56] References Cited

U.S. PATENT DOCUMENTS

| | | | |
|---|---|---|---|
| 4,484,978 | 11/1984 | Keyser . | |
| 4,676,867 | 6/1987 | Elkins et al. | 156/643 |
| 4,783,248 | 11/1988 | Kohlhase et al. | 204/192.17 |
| 4,820,393 | 4/1989 | Brat et al. | 204/192.15 |
| 4,980,301 | 12/1990 | Harrus et al. | 437/12 |
| 5,208,472 | 5/1993 | Su et al. | 257/344 |
| 5,219,791 | 6/1993 | Freiberger . | |
| 5,240,880 | 8/1993 | Hindman et al. | 437/190 |
| 5,246,883 | 9/1993 | Lin et al. . | |
| 5,277,835 | 1/1994 | Ohmi et al. . | |
| 5,288,665 | 2/1994 | Nulman | 437/194 |
| 5,290,727 | 3/1994 | Jain et al. | 437/52 |
| 5,290,731 | 3/1994 | Sugano et al. | 437/174 |
| 5,319,247 | 6/1994 | Matsuura | 257/760 |
| 5,356,836 | 10/1994 | Chen et al. | 437/194 |
| 5,393,702 | 2/1995 | Yang et al. | 437/195 |
| 5,399,533 | 3/1995 | Pramanik et al. | 437/228 |
| 5,427,666 | 6/1995 | Mueller et al. | 204/192 |
| 5,429,988 | 7/1995 | Huang et al. | 437/187 |
| 5,457,073 | 10/1995 | Ouellet | 437/231 |
| 5,470,792 | 11/1995 | Yamada | 437/155 |
| 5,472,912 | 12/1995 | Miller | 437/194 |
| 5,629,237 | 5/1997 | Wang et al. . | |
| 5,716,535 | 2/1998 | Lee et al. . | |

FOREIGN PATENT DOCUMENTS

| | | |
|---|---|---|
| 4-63414 (A) | 2/1992 | Japan . |
| 6-112203 (A) | 4/1994 | Japan . |

OTHER PUBLICATIONS

C.K. Wang, L.M. Liu, H.C. Cheng, H.C. Huang & M.S. Lin, *A Study of Plasma Treatments on Siloxane SOG*, VMIC CONF., 1994 ISMIC–103/94/101, Jun. 7–8, pp. 101–108.

M. Matsuura, Y. Ii, K. Shibata, Y. Hayashide & H. Kotani, *An Advanced Interlayer Dielectric System with Partially Converted Organic SOG by Using Plasma Treatment*, VMIC CONF., 1993 ISMIC–102/93/0113, Jun. 8–9, pp. 113–115.

S. Itoh, Y. Homma, E. Sasaki, S. Uchimura & H. Morishima, *Application of Surface Reformed Thick Spin–on–Glass to MOS Device Planarization*, J. ELECTROCHEM. SOC., vol. 137, No. 4, Apr. 1990, pp. 1212–1218.

Y. Takata, A. Ishii, M. Matsuura, A. Ohsaki, M. Iwasaki, J. Miyazaki, N. Fujiwara, J. Komori, T. Katayama, S. Nakao & H. Kotani, *A Highly Reliable Multilevel Interconnection Process*, VMIC CONF., 1991 Jun. 11–12, pp. 13–19.

F. S. Chen, Y.S. Lin, G. A. Dixit, R. Sundaresan, C. C. Wei & F. T. Liou, *Planarized Aluminum Metallization For Sub*, SGS–THOMSON MICROELECTRONICS, 1990 pp. 3.4.1–3.4.3.

S. Wolf, *Silicon Processing for the VLSI Era*, LATTICE PRESS, vol. 2, 1990, pp. 107–191.

J. H. Chiang & K. C. Wang, *A Novel Technology for Half–Micron Aluminum Planarization Using In–Situ Ti/TiN/Al Metallization*, WINDBOND ELECTRONICS CORP., pp. 55–62.

*Primary Examiner*—Caridad Everhart
*Attorney, Agent, or Firm*—Proskauer Rose LLP

[57] ABSTRACT

A contact opening formation process is disclosed for forming an opening having a positive base profile. This opening is formed by etching a pre-metal dielectric layer of an undoped oxide underlayer covered by a BPSG overlayer. The etching is performed using an etchant that etches the BPSG layer faster than the oxide underlayer. The etching solution is by weight at least 97.35% distilled water, 0.45% of HF and 2.2% of $NH_4F$.

9 Claims, 2 Drawing Sheets

METHOD OF FORMING CONTACT PROFILE BY IMPROVING TEOS/BPSG SELECTIVITY FOR MANUFACTURING A SEMICONDUCTOR DEVICE

RELATED APPLICATIONS

The following patent applications are assigned to the assignee hereof and contain subject matter related to the subject matter of the present patent application:

1. U.S. patent application Ser. No. 08/431,927, entitled "Aluminum Planarization Using In-Situ Ti/TiN/Al Metallization", filed on Apr. 28, 1995, for Jing-Hua CHIANG;
2. U.S. patent application Ser. No. 08/432,026, entitled "In-Situ Pre-PECVD Oxide Deposition Process For Treating SOG", filed on May 1, 1995, for Chin-Hao CHOU, Yu-Chen YANG and Shing-Hsiang HUNG; and
3. U.S. patent application Ser. No. 08/503,286, entitled "Al-Based Contact Formation Process Using Ti Glue Layer to Prevent Nodule-Induced Bridging", filed Jul. 7, 1995 for Kuang-Chih WANG.

The contents of the above-listed patent applications are incorporated herein by reference.

FIELD OF THE INVENTION

The present invention relates to semiconductor integrated circuit (IC) fabrication. In particular, the present invention relates to a method for forming a positive contact profile which prevents widening of the base of the contact.

BACKGROUND OF THE INVENTION

A conventional MOS device with sub-micron dimensions is illustrated in FIG. 1A. Illustratively, the device 10 of an integrated circuit (IC) is formed in a P-well region 12 of an N-type silicon substrate. $N^+$-type source and drain regions 14 and 16 are formed in the P-well 12. Field oxide (FOX) regions 15, 17, which are relatively thick oxide regions, separate the device 10 from adjacent devices formed on the substrate. The gate 18 is made from polysilicon. The gate 18 is separated from the P-well surface by the thin gate oxide 19 and has dielectric spacers 20, which also may be oxide formed on its laterally adjacent sides.

The device 10 is covered by a pre-metal dielectric (PMD) layer 30 having a thickness of 6000~9000 Angstroms. Illustratively, the PMD layer 30 has a lower layer 32 covered by an upper layer 34. The lower layer 32 is a layer of undoped oxide such as TEOS (Tetraethylorthosilicate) oxide or siloxane based oxide. The upper layer 34 is BPSG (borophosphosilicate glass) or PSG (phosphosilicate glass). The PMD layer 30 is formed using a low pressure chemical vapor deposition system or atmospheric pressure chemical vapor deposition system.

The subject of the present invention is the formation of contact openings 40 over the source and drain regions 14 and 16. A metallization process deposits metal in the contact openings 40 to form metal contacts 50. The contact openings 40 are formed by etching the PMD layer 30. The etching involves two steps, a BHF wet etch followed by anisotropic dry etch, in which steps the PMD layer 30 is 40% and 60% etched, respectively. Typically, the vertical contact opening aspect ratio (depth/width) is about 1.4~1.7.

Prior to the metallization process that forms the metal contact 50 shown in FIG. 1A, and after etching the PMD layer 30 to form the contact openings 40, a second wet etching step is performed to remove native oxides from the contact openings 40. Native oxides are undesirable as they cause discontinuity between the metal contact 50 and the substrate. This increases contact resistance and degrades performance of the IC. The second wet etch that removes the native oxides results in a vertical contact opening 40A shown in FIG 1B.

A reflow step may be performed to round off the top of the contact opening 40 Å before the second wet etch process. The vertical contact opening 40A may be shaped into a champagne glass shape opening. FIG. 1C shows a champagne glass shape opening 40B formed by a reflow step that tapers and rounds off the top of the vertical contact opening 40A (FIG. 1B).

After removing the native oxides, the metal contacts 50 are formed in the openings 40 according to a so-called metal (I) process. A variety of processes have been suggested in the prior art for the metal (I) process and these are reviewed below. In general, the metal (I) process is used to form metal (I) contacts 50 in the contact openings 40. However, in order to interconnect devices formed on the surface of the same substrate, it is necessary to form vias which extend horizontally on the substrate surface (not shown in FIG. 1). To form the vias, an inter-metal dielectric (IMD) involving a PECVD/SOG/PECVD (plasma enhanced chemical vapor deposition oxide/spin-on glass/plasma enhanced chemical vapor deposition oxide) sandwich is formed on the substrate surface. Openings for the vias are then etched in the inter-metal dielectric. Then, metal is formed in the via openings using a metal (II) process.

In a MOSFET device with submicron dimensions, submicron metallization has been formed using the conventional W(tungsten)-CVD plug process. Alternatively, a conventional Al-based metallization process may be used.

The conventional aluminum process for forming the metal (I) contact may be understood in connection with FIG. 2. A conventional sputtering machine is used.

The steps for forming the metal (I) contact 50 in the opening 40 are as follows:

(1) in the sputtering machine, grow a layer of Ti 82 with a thickness of about 400 Å in the contact openings;
(2) in the sputtering machine, grow a layer of TiN 84 with a thickness of about 1000 Å in the contact opening; (The sputtering steps (1) and (2) take place in a high vacuum maintained in a chamber of the sputtering machine. The base pressure is $10^{-7}$ to $10^{-9}$ Torr. The process pressure is around the $10^{-3}$ Torr range.
(3) The wafer is removed from the sputtering chamber and exposed to air;
(4) The wafer is annealed at a temperature of about 450 degrees for about 30 minutes;
(5) The wafer is then returned to the sputtering machine and an aluminum based layer 86 with a thickness of about 4500–6000 Angstroms is deposited by sputtering at a temperature of about 300° C. The aluminum based layer 86 may be an Al—Si—Cu alloy or other Al-based alloy.
(6) The wafer is then moved to another chamber and a conventional TiN layer (not shown in FIG. 2) is deposited by sputtering with a thickness of about 400 Angstroms to serve as a conventional anti-reflection coating (ARC).

This completes the metal (I) deposition process.

Then, the inter-metal dielectric (IMD) layers are formed. Next, the wafer is subjected to lithography to pattern the IMD to form via openings for the vias formed by a metal (II) process.

The purpose of the Ti/TiN layers is to prevent aluminum from diffusing into the silicon substrate. The Ti/TiN layers serve as a barrier for aluminum diffusion. If the Ti/TiN barrier is not good enough and Aluminum diffuses through the barrier into the silicon substrate, there will be junction leakage and device failure. The purpose of the vacuum break and anneal steps is to stuff the grain boundaries of the Ti/TiN layers so that the aluminum and silicon do not diffuse together in the subsequent aluminum deposition step.

An important problem with conventional formation of the opening 40 is widening of the bottom of the opening 40. During the etching steps that form and clean the opening 40, in both the vertical and the champagne glass shape openings 40A, 40B (FIGS. 1B, 1C), the bottom of the contact opening widens due to different etch rates of the lower and upper layers 32, 34. Thus, as shown in FIGS. 1B, 1C, and 2, the width 60 at the base or bottom of the contact openings 40, 40A, 40B, which is in the lower oxide layer 32, is larger than the width 62 of the contact openings 40, 40A, 40B, at the upper BPSG layer 34. The wide or "negative profile" of the bottom of the openings 40, 40A, 40B results in poor step coverage during the metal (I) process.

As shown in FIG. 2, the side wall thickness of the aluminum based layer 86 approaches zero at the lower portion of the contact opening 40. The thickness "a" of the Ti/TiN/Al layers 82, 84, 86 near the top of the opening 40 is more than the thickness "b" near the bottom of the opening 40. This results in poor step coverage SC, where SC equals: SC=(b/a)×100%. The poor step coverage during the metal (I) process may lead to less metal continuity, higher contact resistance, and even lower device reliability and an increased failure rate.

Accordingly, it is an object of the invention to provide a special etch to form a positive profile at the bottom of the contact opening to overcome the shortcomings of the prior art.

In particular, it is an object of the invention, to provide an etching solution so that etching is faster in the BPSG layer than in the TEOS oxide under layer of the PMD layer.

SUMMARY OF THE INVENTION

A novel contact opening formation process using a particular etchant for a sub-micron semiconductor device is proposed. According to one embodiment, a pre-metal dielectric (PMD) layer comprising an undoped oxide underlayer covered with a BPSG layer is etched so that the BPSG layer is etched faster than the undoped oxide underlayer.

Illustratively, the etchant solution is approximately 130 parts distilled water and, 1 part of 49% solution of HF and 7 parts of 40% solution of $NH_4F$. In particular, the etchant solution comprises by weight at least 97.35% distilled water, 0.45% of HF, and 2.2% of $NH_4F$.

The inventive etching process prevents formation of an opening having a bottom with a negative profile. This improves step coverage and continuity of the metal contact formed in the opening.

DETAILED DESCRIPTION OF A PREFERRED EMBODIMENT OF THE INVENTION

Figure 3:
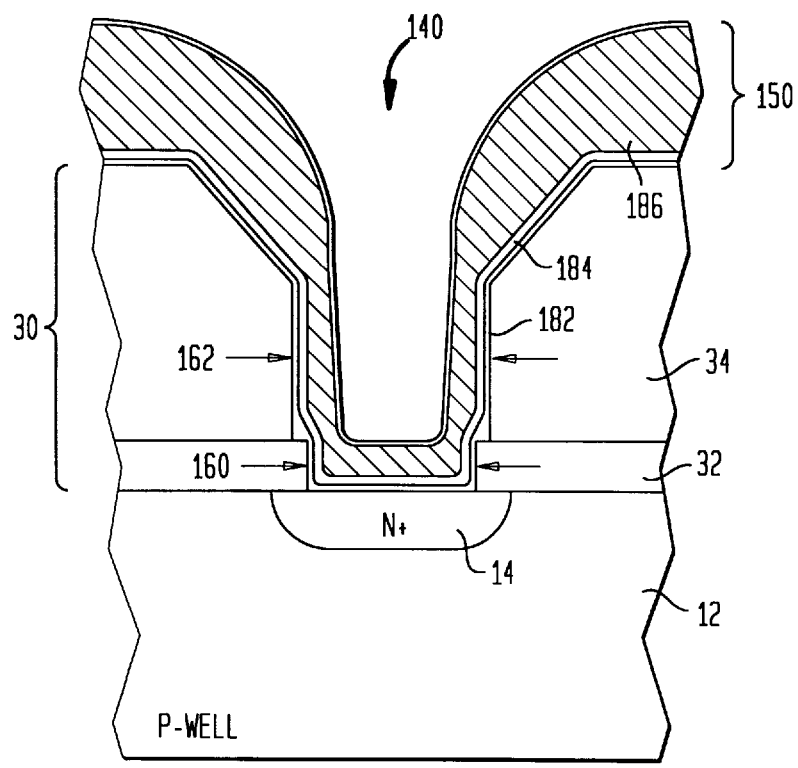
FIG. 3 illustrates a metal contact in an opening formed according to the invention.

FIG. 3 shows a contact opening 140 formed in premetal dielectric (PMD) layer 30 of a sub-micron semiconductor, such as an MOS device, according to the invention. A metallization process is used to form a metal (I) contact 150 in the contact opening 140.

The premetal dielectric (PMD) 30 is etched to form the contact opening 140. The premetal dielectric 30 includes an undoped oxide underlayer 32 having a thickness of 1000~2000 Å and a BPSG or PSG layer 34 having a thickness of 5000~7000 Å. The etching of the contact opening 140 includes two steps. BHF wet etch followed by anisotropic dry etch. After the contact openings 140 are formed, the structure may be subjected to a reflow step to round the top of the contact openings. The contact aspect ratio is about 1.4~1.7. The above steps are used in a conventional metal (I) process.

Next, a second wet etch is performed. Illustratively, the second wet etching is performed for 0.5~3 minutes at a temperature of 21°~25° Celsius. The second wet etching cleanses the contact openings 140 to remove native oxides. A particular etchant is used to etch the BPSG layer 34 at a faster rate than the undoped oxide underlayer 32. According to one embodiment, the wet etchant solution used in the second wet etching step is approximately 130 parts distilled water, 1 part of 49% solution of HF, and 7 parts of 40% solution of $NH_4F$.

Illustratively, the second wet etchant solution comprises by weight from 97.0% to 97.7% distilled water, from 0.35% to 0.55% HF and from 1.95% to 2.45% $NH_4F$. Preferably, the etchant solution consists of at least 97.35% distilled water, 0.45% of HF, and 2.2% of $NH_4F$.

Figure 1A:
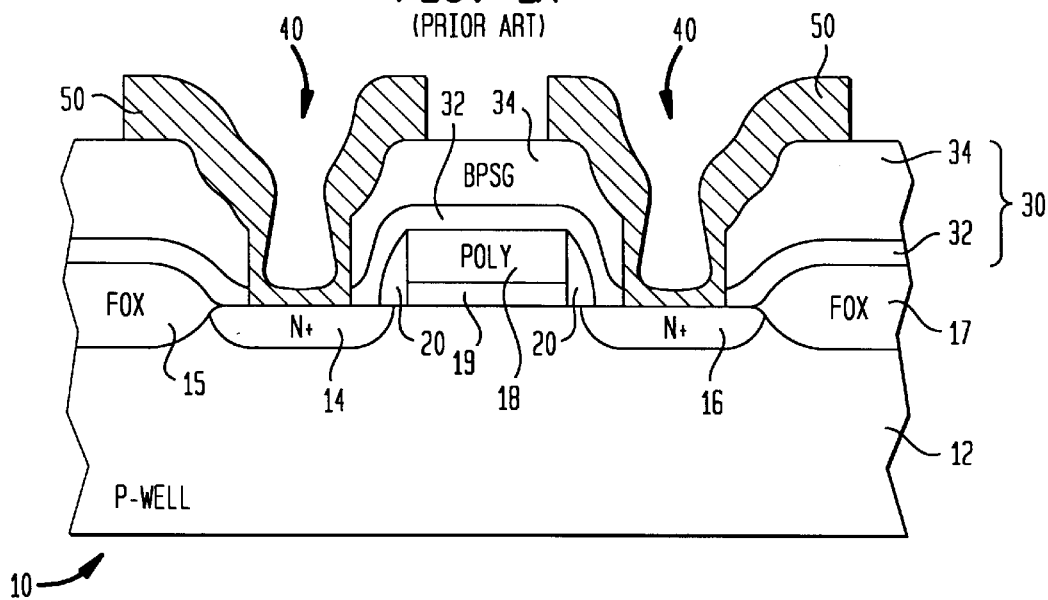
FIG. 1A illustrates a conventional MOSFET device.
Figure 1B:
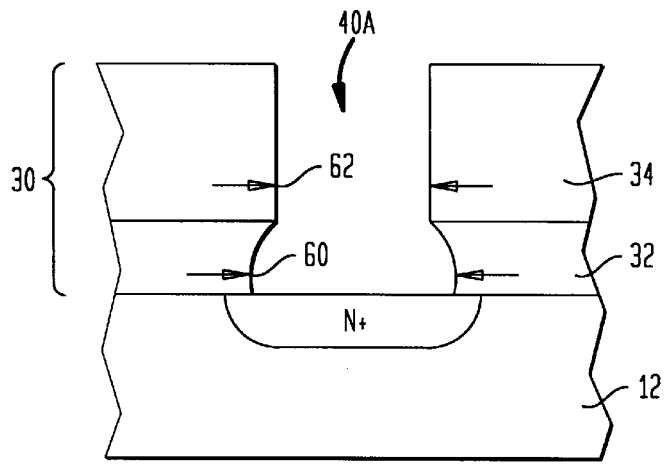
FIGS. 1B–1C respectively illustrate a conventional vertical and champagne glass shape openings.
Figure 1C:
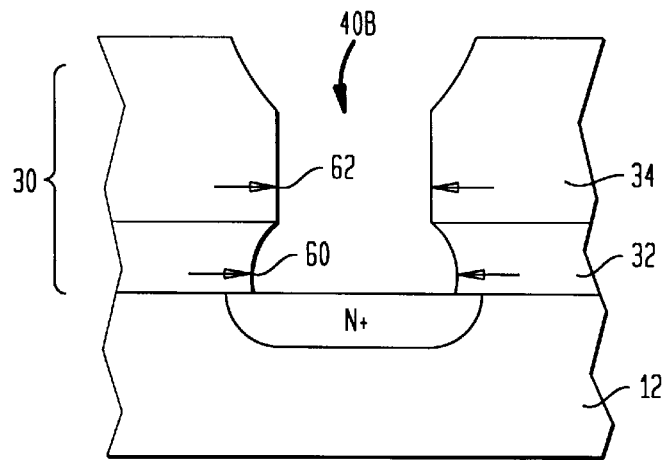
Figure 2:
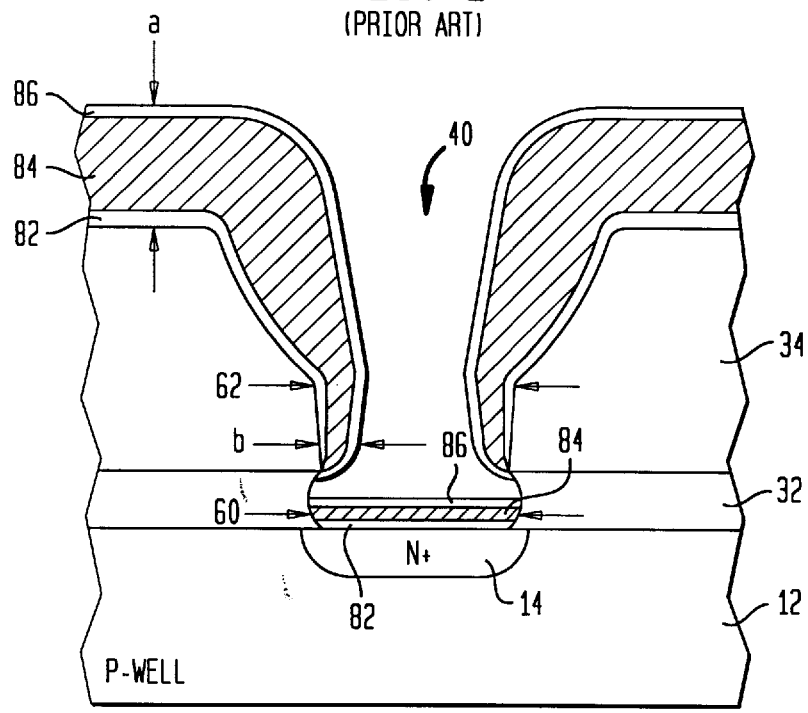
FIG. 2 illustrates a metal contact in an opening formed by a conventional process.

This results in the contact opening 140 having a non-negative base profile. Such a contact opening 140 is not wider at its bottom. Thus, unlike the contact openings 40, 40A, 40B (FIGS. 1A–1C) formed by a conventional process, the contact opening 140 does not have a negative base profile. Instead, the width 160 at the base or bottom of the contact opening 140, which is in the lower oxide layer 32, is nearly equal to the width 162 of the contact opening 140 at the upper BPSG layer 34.

The inventive etching process may be controlled to form an opening having a positive base profile. An opening having a positive base profile has a base width 160 (in the oxide underlayer 32), which is smaller than the width 162 of the opening 140 in the BPSG layer 34.

Next, a metal (I) deposition process is performed to form the metal (I) contact 150 in the opening 140. The metal (I) deposition process includes the steps (2) to (7) disclosed above. Ti, TiN and Al-based layers 182, 184, 186 are formed in the opening 140. Because the opening 140 does not have a negative base profile, there is good step coverage during the metal (I) deposition process.

After forming the metal (I) contact 150, the metal (II) deposition process is performed according to the following steps:

(a) An intermetal dielectric (IMD) is deposited on the substrate. The intermetal dielectric is a PECVD/SOG/PECVD sandwich structure. The siloxane SOG material is used to achieve IMD planarization.

(b) Via holes are opened by BHF wet etch and anisotropic dry etch.

(c) Then, the metal (II) contact is deposited with the sequence of:

a Ti glue layer, an Al/Si/Cu layer, and a TiN ARC.

The aluminum deposition temperature in the metal (II) process can be lower than the aluminum deposition temperature in the metal (I) process due to the looser aspect ratio in the via level. The lower temperature of aluminum is also helpful for preventing SOG from out-gassing.

After the metal (II) process is complete, conventional device passivation layers are deposited.

The inventive etching process forms a vertical or champagne glass shape contact opening which does not have a negative profiled base. Furthermore, the inventive etching process allows formation of a contact opening having a positive profiled base. The prevention of forming a contact opening having a negative profiled base improves step coverage and continuity of the metal contact formed in the opening.

Finally, the above-described embodiments of the invention are intended to be illustrative only. Numerous alternative embodiments may be devised by those skilled in the art without departing from the spirit and scope of the following claims.

The claimed invention is:

1. A method for forming a contact opening in a semiconductor structure comprising the steps of:

forming on the semiconductor structure a pre-metal dielectric having an underlayer and an overlayer, and forming a contact opening having a non-negative base profile, wherein said step of forming the contact opening comprises the steps of:

first wet etching the pre-metal dielectric, anisotropic etching of the wet etched contact opening, and second wet etching the anisotropically etched contact opening with an etching solution comprising approximately 130 parts distilled water, 1 part of 49% solution of HF, and 7 parts of 40% solution of $NH_4F$ so that the overlayer is etched at a faster rate than the underlayer.

2. The method of claim 1 wherein said step of forming the pre-metal dielectric comprises forming an oxide underlayer and a BPSG overlayer.

3. The method of claim 1 wherein the etching solution is by weight approximately from 97.0% to 97.7% distilled water, from 0.35% to 0.55% HF, and from 1.95% to 2.45% $NH_4F$.

4. The method of claim 1 wherein the second wet etching is performed for 0.5~3 minutes at a temperature of 21°~25° Celsius.

5. The method of claim 1 further comprising the step of depositing a first metallization on said semiconductor structure.

6. The method of claim 5 wherein said step of depositing the first metallization comprises the steps of:

forming a first Ti barrier metal layer in said contact opening, forming a second TiN barrier metal layer on said first Ti barrier metal layer, and forming an aluminum based layer on said second TiN barrier metal layer.

7. The method of claim 5 further comprising the step of depositing a second metallization on said semiconductor structure.

8. The method of claim 7 wherein said step of depositing the second metallization comprises the steps of:

forming a first inter-metal dielectric on said etched back BPSG layer, forming an SOG layer on said first inter-metal dielectric forming a second inter-metal dielectric on said SOG layer, forming a via opening extending from said second inter-metal dielectric to said first metallization, and forming a metal via in said via opening.

9. A method for forming a contact opening in a premetal dielectric layer formed on a substrate of a semiconductor structure, wherein the premetal dielectric is a BPSG overlayer formed on an undoped oxide underlayer, comprising the steps of:

contacting the premetal dielectric layer with an etching solution comprising by weight at least approximately 97.35% distilled water, at most approximately 0.45% of HF and at most approximately 2.2% of $NH_4F$, so that the BPSG overlayer in etched at a faster rate than the undoped oxide underlayer.

* * * * *